United States Patent
Miyaura

[11] Patent Number: 6,104,259
[45] Date of Patent: Aug. 15, 2000

[54] HARMONIC SUPPRESSION CIRCUIT

[75] Inventor: Masao Miyaura, Fukushima-ken, Japan

[73] Assignee: Alps Electric Co., Ltd., Tokyo, Japan

[21] Appl. No.: 09/255,051

[22] Filed: Feb. 22, 1999

[30] Foreign Application Priority Data

Nov. 3, 1998 [JP] Japan .................................. 10-059209

[51] Int. Cl.$^7$ ..................................................... H03H 7/00
[52] U.S. Cl. .......................... 333/176; 333/204; 330/286; 330/302
[58] Field of Search ............................ 333/176, 12, 202, 333/219, 204, 81 A; 330/286, 302, 306

[56] References Cited

FOREIGN PATENT DOCUMENTS 6-268406  9/1994  Japan .
9-64601   3/1997  Japan .

Primary Examiner—Robert Pascal
Assistant Examiner—Kimberly Glenn
Attorney, Agent, or Firm—Brinks Hofer Gilson & Lione

[57] ABSTRACT

Disclosed herein is a harmonic suppression circuit having a first microstrip line and a second microstrip line each having the same characteristic impedance. One end of the first microstrip line is electrically connected to a transmission line over which a signal having a predetermined frequency is transmitted, and one end of the second microstrip line is grounded. The length of the first microstrip line and the length of the second microstrip line are respectively set to the length corresponding to ⅛ of the wavelength with respect to the predetermined frequency. Series impedance means comprised of capacitance means and inductance means is electrically connected between the other end of the first microstrip line and the other end of the second microstrip line. The reactance of the capacitance means and the reactance of the inductance means at the predetermined frequency are respectively set to ¾ of the characteristic impedance of each microstrip line.

3 Claims, 3 Drawing Sheets

HARMONIC SUPPRESSION CIRCUIT

BACKGROUND OF THE INVENTION

1. Field of the Invention

The present invention relates to a harmonic suppression circuit for attenuating harmonics developed in an amplifier, etc.

2. Description of the Related Art

A conventional harmonic suppression circuit will be described using FIGS. 3 through 6. FIG. 3 shows a circuit for suppressing a multiple harmonic, and FIG. 5 illustrates a circuit for suppressing a multiple harmonic and a triple harmonic simultaneously, respectively. FIGS. 4 and 6 respectively show characteristics of the harmonic suppression circuits shown in FIGS. 3 and 5.

Referring first to FIG. 3, an amplifier 11 is a high-frequency amplifier such as a receiver or the like. The amplifier 11 is configured or formed on an unillustrated printed board and amplifies signals lying within an SHF band (e.g., 5.8 GHz). The amplifier 11 has a high amplification factor to amplify a weak signal and generates unnecessary harmonics (multiple harmonic and triple harmonic in particular) at a high level. Therefore, a microstrip line 12 for attenuating the harmonics is provided on the output side of the amplifier 11. The microstrip line 12 is formed on the printed board. One end of the microstrip line 12 is electrically connected to a signal transmission line 13 provided on the output side of the amplifier 11, and a terminal thereof is closed. Further, the length of the microstrip line 12 is set to ⅛ of the wavelength with respect to a frequency (corresponding to the frequency of a fundamental wave) of a received signal. Therefore, the impedance on the microstrip line 12 side as viewed from the signal transmission line 13 becomes extremely small at a frequency (multiple harmonic, frequency: $2f_0$) corresponding to twice the frequency of the received signal. Thus, the multiple harmonic ($2f_0$) is attenuated as shown in FIG. 4.

When it is desired to attenuate a triple harmonic ($3f_0$) as well as the multiple harmonic ($2F_0$), another microstrip line 14 is further electrically connected to the signal transmission line 13 as shown in FIG. 5 and the termination of the microstrip line 14 is opened. The length of the microstrip line 14 is set to 1/12 of the wavelength with respect to the frequency ($f_0$) of the received signal. As a result, the impedance on the microstrip line 14 side as viewed from the signal transmission line 13 becomes extremely small with respect to the harmonic ($3f_0$) corresponding to three times the frequency of the received signal (theoretical impedance is 0 ohm). Thus, the triple harmonic ($3f_0$) is attenuated as shown in FIG. 6. Further, the multiple harmonic ($2f_0$) and the triple harmonic ($3f_0$) can be attenuated simultaneously.

In the above-described conventional construction, however, the microstrip line 12 for attenuating the multiple harmonic ($2f_0$) reduces the impedance at the frequency ($f_0$) of the fundamental wave and attenuates the signal of the fundamental wave ($f_0$) to 5 to 8 dB as is apparent from points A and B shown in FIG. 4 and 6. Therefore, a problem arises in that the received signal becomes short of sensitivity, the circuit connected to the stage subsequent to the high-frequency amplifier 11 is impeded in operation, and NF is deteriorated.

SUMMARY OF THE INVENTION

With the foregoing in view, it is therefore an object of the present invention to provide a harmonic suppression circuit capable of effectively attenuating harmonics without attenuating a signal of a fundamental wave.

According to one aspect of this invention, for achieving the above object, there is provided a harmonic suppression circuit, comprising:

a first microstrip line, and a second microstrip line, the first and second microstrip lines having the same characteristic impedance, and wherein one end of the first microstrip line is electrically connected to a transmission line over which a signal having a predetermined frequency is transmitted, one end of the second microstrip line is grounded, the length of the first microstrip line and the length of the second microstrip line are respectively set to the length corresponding to ⅛ of the wavelength with respect to the predetermined frequency, series impedance means comprised of capacitance means and inductance means is electrically connected between the other end of the first microstrip line and the other end of the second microstrip line, and the reactance of the capacitance means and the reactance of the inductance means at the predetermined frequency are respectively set so as to reach ¾ of the characteristic impedance of each microstrip line.

According to the harmonic suppression circuit of the present invention as well, an amplifier for amplifying the signal having the predetermined frequency is provided and one end of the first microstrip line is electrically connected to the output end side of the amplifier.

Further, according to the harmonic suppression circuit of the present invention, a leadless capacitor having a terminal electrode is used as the series impedance means and the terminal electrode is used as the inductance means.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
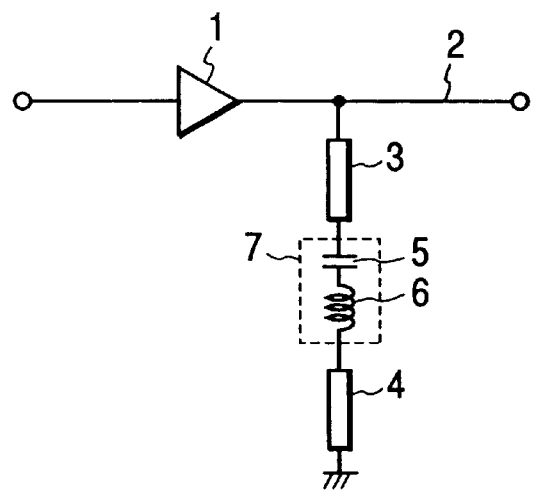
FIG. 1 is a circuit diagram showing a harmonic suppression circuit of the present invention.
Figure 2:
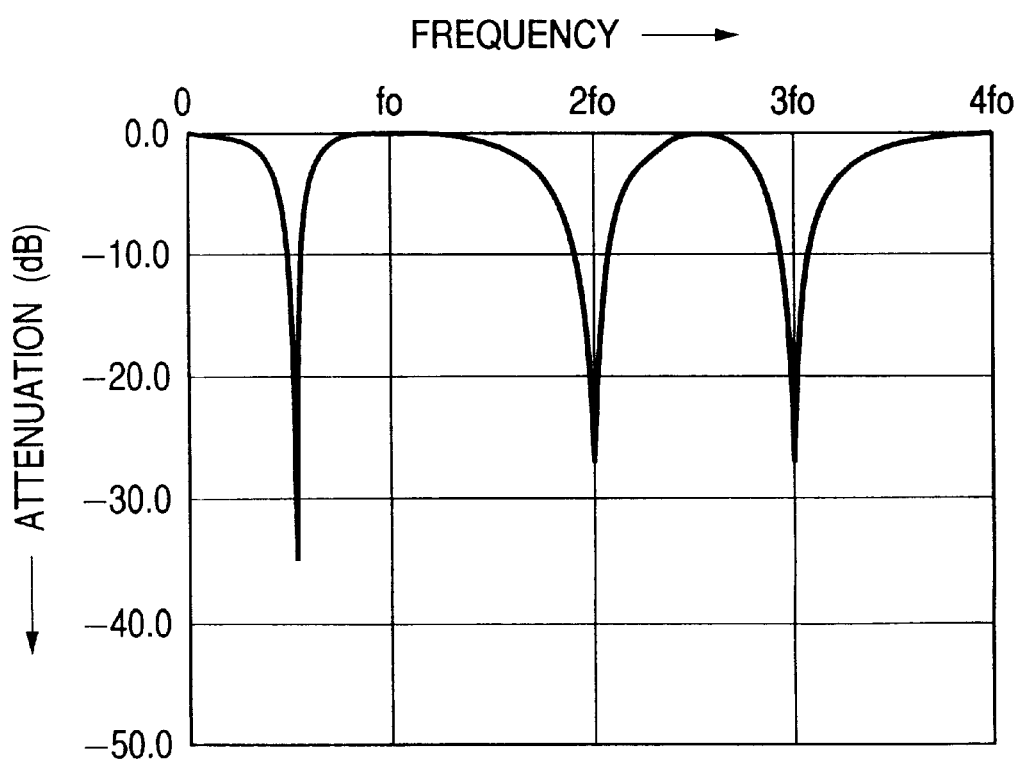
FIG. 2 is a characteristic diagram of the harmonic suppression circuit of the present invention.
Figure 3:
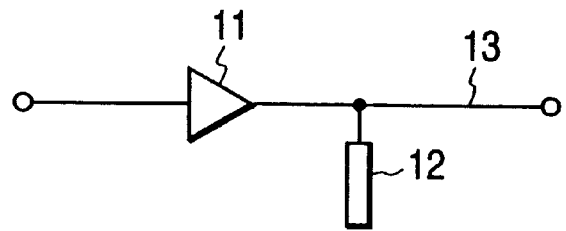
FIG. 3 is a circuit diagram illustrating a conventional harmonic suppression circuit.
Figure 4:
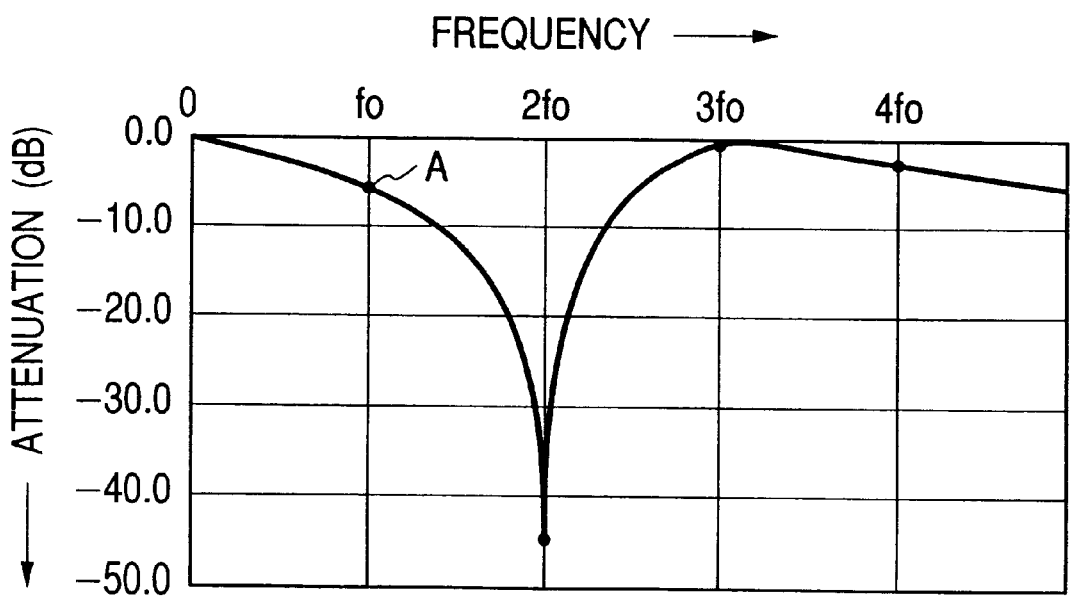
FIG. 4 is a characteristic diagram of the harmonic suppression circuit shown in FIG. 3.
Figure 5:
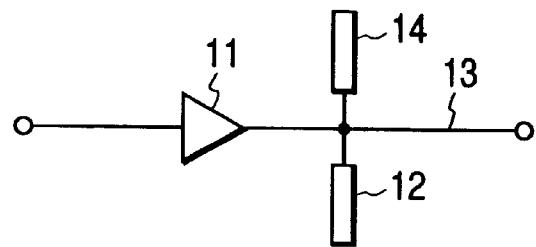
FIG. 5 is a circuit diagram showing another example of the conventional harmonic suppression circuit.
Figure 6:
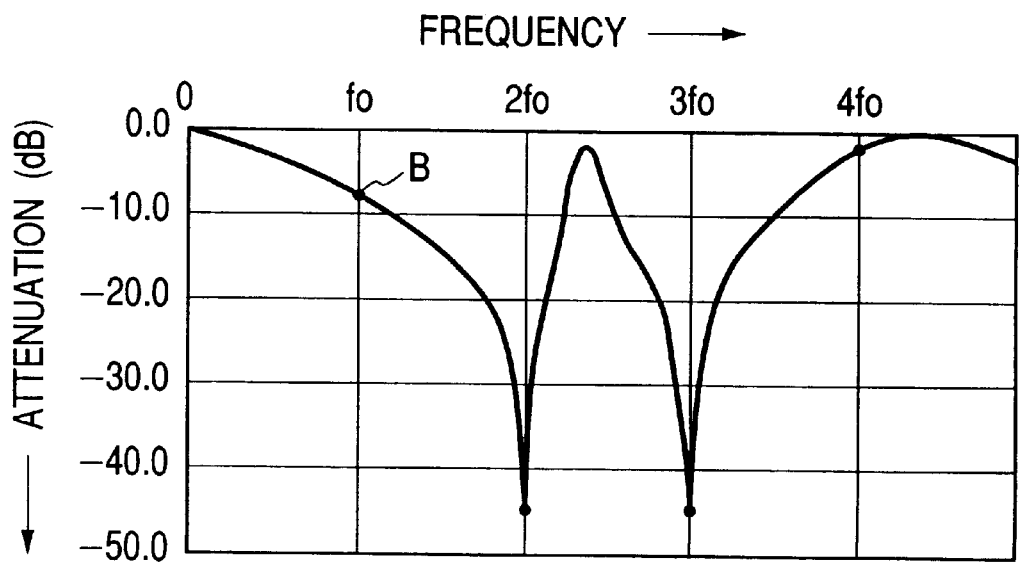
FIG. 6 is a characteristic diagram of the harmonic suppression circuit shown in FIG. 5.

A harmonic suppression circuit of the present invention will hereinafter be described with reference to FIGS. 1 and 2. FIG. 1 is a diagram showing a circuit configuration of the harmonic suppression circuit of the present invention, and FIG. 2 is a characteristic diagram of the harmonic suppression circuit of the present invention.

First of all, an amplifier 1 is a high-frequency amplifier such as a receiver or the like. The amplifier 1 is formed on an unillustrated printed circuit board and amplifies a weak signal lying in an SHF band (e.g., 5.8 GHz). A first microstrip line 3, a second microstrip line 4, capacitance means 5 having a small capacitance (C), and inductance means 6 having a small inductance (L) are electrically series-connected between a signal transmission line 2 electrically connected to the output end side of the amplifier 1 and the ground. That is, one end of the first microstrip line 3 is electrically connected to the signal transmission line 2, and one end of the second microstrip line 4 is electrically connected to the ground. Further, series impedance means 7 comprised of the capacitance means 5 and the inductance means 6 is electrically connected between the other end of the first microstrip line 3 and the other end of the second microstrip line 4.

Now, the lengths (d) of the first microstrip line 3 and the second microstrip line 4 are respectively set to about ⅛ of the wavelength ($\lambda_0$) with respect to a predetermined frequency (fundamental frequency $f_0$) of a signal inputted to the amplifier 1. Both the characteristic impedance ($Z_0$) of the first microstrip line 3 and that ($Z_0$) of the second microstrip line 4 are set so as to be equal to each other. Further, the reactance ($1/\omega_0 C$) of the capacitance means 5 and the reactance ($\omega_0 L$) of the inductance means 6 at the predetermined frequency ($f_0$) are both set to ¾ of the characteristic impedance ($Z_0$) of each of the first and second microstrip lines 3 and 4.

In the above-described construction, the impedance $Zin_4$ on the second microstrip line 4 side as viewed from a point where the second microstrip line 4 and the impedance means 7 are electrically connected to each other, is first given by the following equation 1. In the equation, $Z_0$ indicates the characteristic impedance of the second microstrip line 4 and d indicates the length of the second microstrip line 4. Further, β indicates a phase constant and is given by the following equation 2. $\lambda_0$ in the equation 2 indicates the wavelength at the fundamental frequency ($f_0$).

Assuming now that the reactance of the impedance means 7 is taken as X, the impedance $Zin_3$ on the second microstrip line 4 side as viewed from one end of the first microstrip line 3 is given by the following equation 3.

$$\beta = \frac{2\pi}{\lambda_0} \qquad (2)$$

$$Zin_3 = Z_0(jX + jZ_0\tan\beta d) + \frac{jZ_0\tan\beta d}{Z_0 + j(jX + jZ_0\tan\beta d)\tan\beta d} \qquad (3)$$

Since the reactance ($\omega_0 L$) of the inductance means 6 and the reactance ($1/\omega_0 C$) of the capacitance means 5 in the impedance means 7 are first identical to each other at the fundamental-wave frequency ($f_0$) (they are equal to ¾ of the characteristic impedance $Z_0$), X in the equation 3 results in 0. Thus, the other end of the first microstrip line 3 and the other end of the second microstrip line 4 are brought to a directly-connected state at the fundamental frequency ($f_0$). Further, the entire length of the first and second microstrip lines 3 and 4 becomes ¼ of the wavelength ($\lambda_0$) with respect to the frequency ($f_0$) of the fundamental wave. As a result, the impedance $Zin_3$ on the second microstrip line 4 side as viewed from one end of the first microstrip line 3, i.e., from the signal transmission line 2 becomes extremely large (theoretically reaches infinity).

As a result, the signal of the fundamental wave, which passes through the signal transmission line 2, is not attenuated.

On the other hand, at a frequency ($2f_0$) corresponding to twice the frequency of the fundamental wave, the length of the second microstrip line 4 becomes ¼ of the wavelength with respect to that frequency. Further, the impedance of the second microstrip line 4 at the other end (corresponding to the point where the impedance means 7 and the second microstrip line 4 are electrically connected to each other) of the second microstrip line 4 becomes extremely great (theoretically reaches infinity). Accordingly, the other end of the first microstrip line 3 is opened. As a result, the impedance on the second microstrip line 4 side as viewed from one end of the first microstrip line 3 becomes extremely small (theoretically reaches 0).

As a result, a signal having the frequency corresponding to twice the frequency of the fundamental wave at the signal transmission line 2 is attenuated.

At a frequency ($3f_0$) corresponding to three times the frequency of the fundamental wave, the reactance X of the impedance means 7 results in $X=2Z_0$. Thus, when $X=2Z_0$ and $d=\lambda_0*⅜$ in the equation 3, $Zin_3$ is given as the following equation 4. Now, the length of each of the first and second microstrip lines 3 and 4 is $d=\lambda_0*⅜$ at the frequency ($3f_0$) corresponding to three times the fundamental-wave frequency. Substituting this value in the equation 4 yields the impedance $Zin_3=0$ on the second microstrip line 4 side as viewed from one end of the first microstrip line 3, i.e., the signal transmission line 2.

As a result, a signal having the frequency corresponding to three time the fundamental-wave frequency at the signal transmission line 2 is attenuated.

$$Zin_3 = Z_0 \frac{(j2Z_0 + jZ_0\tan\beta d) + jZ_0\tan\beta d}{Z_0 + j(j2Z_0 + jZ_0\tan\beta d)\tan\beta d} \qquad (4)$$

As described above, the individual reactance ($\omega_0$ and $1/\omega_0 C$) at the fundamental frequency ($f_0$), of the capacitance means 5 and inductance means 6 constituting the impedance means 7 are respectively set equal to ¾ of the characteristic impedance $Z_0$ of each of the first and second microstrip lines 3 and 4. As a result, the impedance on the second microstrip line 4 side as viewed from one end of the first microstrip line 3 is given as infinity at the fundamental-wave frequency and can be set to 0 at the frequency corresponding to twice the fundamental-wave frequency and the frequency corresponding to three times the fundamental-wave frequency. Thus, a transmission characteristic of the transmission line 2 can be attenuated at the multiple frequency and triple frequency without being attenuated at the fundamental-wave frequency ($f_0$), as shown in FIG. 2.

With respect to the frequency corresponding to ½ of the frequency of the fundamental wave, the length d of each of the first and second microstrip lines 3 and 4 results in $d=\lambda x 1/16$, and the reactance X of the impedance means 7 becomes $X=-Z_0 \times ⅜$. Therefore, the impedance on the second microstrip line 4 side as viewed from one end of the first microstrip line 3 results in 0.

Assuming that the characteristic impedance of each of the first and second microstrip lines 3 and 4 is taken as 50Ω (ohms) and the fundamental-wave frequency is taken as 5.8 GHz, the capacitance of the capacitance means 5 in the impedance means 7 reaches 1 pF (picofarad) or less and the inductance of the inductance means 6 becomes 1 nH (nanohenry) or less. Both of them assume small values respectively. Thus, a leadless capacitor referred to as a so-called "chip capacitor" is effective for as the impedance means 7. The leadless capacitor has an electrode, which functions as the inductance means 6. Further, since the electrode is stable in geometrical dimensions, variations in the inductance are less reduced.

As described above, the high suppression circuit of the present invention has a first microstrip line and a second microstrip line each having the same characteristic impedance. One end of the first microstrip line is electrically connected to a transmission line over which a signal having a predetermined frequency is transmitted. One end of the second microstrip line is grounded. The length of the first microstrip line and the length of the second microstrip line are respectively set to a length corresponding to ⅛ of the wavelength with respect to the predetermined frequency. Series impedance means comprised of capacitance means and inductance means is electrically connected between the other end of the first microstrip line and the other end of the second microstrip line. Further, the reactance of the capacitance means and the reactance of the inductance means at the predetermined frequency are respectively set so as to be ¾ of the characteristic impedance. Therefore, the impedance on the first microstrip line side as viewed from the signal transmission line becomes infinity theoretically at the frequency of the fundamental wave, thus resulting in a similarity to the constitution of an equivalent parallel resonance circuit. Accordingly, the signal having the fundamental-wave frequency is not attenuated.

Further, the impedance on the first microstrip line side as viewed from the signal transmission line theoretically reaches 0 with respect to the multiple frequency and triple frequency, thus resulting in a similarity to the constitution of an equivalent series resonance circuit. Accordingly, the signals having the multiple frequency and triple frequency can be attenuated.

According to the harmonic suppression circuit of the present invention as well, since an amplifier for amplifying a signal having a predetermined frequency is provided and one end of the first microstrip line is electrically connected to the output end side of the amplifier, signals of a secondary harmonic and a tertiary harmonic can be effectively attenuated without attenuating the signal of the fundamental wave.

Further, according to the harmonic suppression circuit of the present invention, since a leadless capacitor having a terminal electrode is used as series impedance means and the terminal electrode is provided as inductance means, variations in the reactance value of the impedance means can be lessened. It is thus possible to lessen variations in the frequency (i.e., fundamental-wave frequency) at which the impedance on the first microstrip line side as viewed from the signal transmission line reaches infinity, and variations in the frequency (i.e., multiple and triple frequencies) at which the impedance on the first microstrip line side as viewed from the signal transmission line. As a result, the signal can be avoided from attenuation at the fundamental-wave frequency and harmonics can be reliably attenuated at the multiple and triple frequencies.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A harmonic suppression circuit, comprising:

a first microstrip line; and a second microstrip line, said first and second microstrip lines having the same characteristic impedance, and wherein one end of said first microstrip line is electrically connected to a transmission line over which a signal having a predetermined frequency is transmitted, one end of said second microstrip line is grounded, the length of said first microstrip line and the length of said second microstrip line are respectively set to the length corresponding to ⅛ of the wavelength with respect to the predetermined frequency, series impedance means comprised of capacitance means and inductance means is electrically connected between the other end of said first microstrip line and the other end of said second microstrip line, and the reactance of said capacitance means and the reactance of said inductance means at the predetermined frequency are respectively set to ¾ of the characteristic impedance of said each microstrip line.

2. The harmonic suppression circuit according to claim 1, wherein an amplifier for amplifying the signal having the predetermined frequency is provided and said one end of said first microstrip line is electrically connected to the output end side of said amplifier.

3. The harmonic suppression circuit according to claim 1, wherein a leadless capacitor having a terminal electrode is used as the series impedance means and said terminal electrode is used as said inductance means.

* * * * *